US012795852B2

(12) United States Patent
Knipp et al.

(10) Patent No.: US 12,795,852 B2
(45) **Date of Patent: *Nov. 10, 2026**

(54) GAMING MACHINE CABINET WITH THERMAL MANAGEMENT

(71) Applicant: Everi Games Inc., Austin, TX (US)

(72) Inventors: Lawrence J. Knipp, Austin, TX (US); Daniel Gibson, Austin, TX (US); Brian Villalobos, Austin, TX (US)

(73) Assignee: Everi Games Inc., Austin, TX (US)

( * ) Notice: Subject to any disclaimer, the term of this patent is extended or adjusted under 35 U.S.C. 154(b) by 169 days.

This patent is subject to a terminal disclaimer.

(21) Appl. No.: 18/669,810

(22) Filed: May 21, 2024

(65) Prior Publication Data

US 2025/0365887 A1 Nov. 27, 2025

(51) Int. Cl.
*H05K 7/20* (2006.01)
*G07F 17/32* (2006.01)

(52) U.S. Cl.
CPC ..... *H05K 7/20145* (2013.01); *G07F 17/3216* (2013.01); *H05K 7/2039* (2013.01)

(58) Field of Classification Search
CPC .. G07F 17/32; G07F 17/3216; G07F 17/3202; G07F 17/3211; G07F 17/34; G07F 17/3209; G07F 9/10; G07F 17/3223; G07F 17/3241; G07F 9/105; G07F 17/3204; G07F 17/42; H05K 7/20145; H05K 5/0214; H05K 7/2039; H05K 7/20572; H05K 7/206; H05K 7/20972; G06F 1/206; G06F 1/20; G06F 1/203; G06F 1/1616; G06F 1/1632; G06F 1/1684; G06F 1/1688; G06F 3/162; H02B 1/565; H04Q 1/035; H04Q 1/02;
(Continued)

(56) References Cited

U.S. PATENT DOCUMENTS 6,280,318 B1 * 8/2001 Criss-Puszkiewicz ...................... H05K 7/20145 361/695
6,491,298 B1 * 12/2002 Criss-Puszkiewicz ...................... G07F 17/3202 273/148 R
(Continued)

FOREIGN PATENT DOCUMENTS

EP 2662843 A2 11/2013
JP 2008161327 A 7/2008
(Continued)

*Primary Examiner* — Michael A Matey
(74) *Attorney, Agent, or Firm* — Spencer Fane LLP; William M. Kelly

(57) ABSTRACT

A gaming machine has a cabinet with improved thermal management. The cabinet has an outer wall forming a lower compartment and an upper compartment above the lower compartment. A processing assembly is positioned in the lower compartment and holds processing devices for controlling operation of the gaming machine. An audio amplifier assembly is also positioned n the lower compartment and holds a plurality of audio amplifiers. A power supply assembly in the lower compartment holding power conversion circuitry and DC voltage supply circuitry supplying the processing assembly and the audio amplifier assembly. An air duct is coupled to an air intake located at or above a top surface of the upper compartment, the air duct carrying cooling air to the lower compartment. A fan is positioned to pull external air into the air duct.

6 Claims, 7 Drawing Sheets

(58) Field of Classification Search
CPC ...... H04Q 1/03; H04Q 2201/06; H04Q 1/025; H04R 1/323; H04R 9/046; H04R 9/06; F04D 25/08; F04D 29/4226; G02F 1/133385; G02F 2201/36
See application file for complete search history.

(56) References Cited

U.S. PATENT DOCUMENTS

| | | | | |
|---|---|---|---|---|
| 7,499,276 | B2 | 3/2009 | Cole | |
| 8,094,450 | B2 * | 1/2012 | Cole | H05K 5/0214 361/695 |
| 8,328,619 | B2 | 12/2012 | Nagano | |
| 10,528,102 | B2 * | 1/2020 | Prajapati | G06F 1/206 |
| 10,878,654 | B2 * | 12/2020 | Wasinger | H05K 7/202 |
| 2006/0042205 | A1 * | 3/2006 | Kalous | F24F 3/163 55/385.1 |
| 2008/0316701 | A1 * | 12/2008 | Cole | G07F 9/10 361/676 |
| 2009/0011839 | A1 * | 1/2009 | Cole | G07F 9/105 463/46 |
| 2010/0029391 | A1 | 2/2010 | Greenberg | |
| 2011/0111838 | A1 * | 5/2011 | Bauer | G06F 1/20 165/104.11 |
| 2013/0061749 | A1 | 3/2013 | LeSourd | |
| 2013/0085000 | A1 | 4/2013 | Nohr | |
| 2013/0148833 | A1 * | 6/2013 | Endo | G06F 1/206 381/332 |
| 2013/0167103 | A1 * | 6/2013 | Burrell | G06F 30/23 716/136 |
| 2016/0360644 | A1 * | 12/2016 | Bains | G06F 1/203 |
| 2018/0350189 | A1 | 12/2018 | Wen | |
| 2019/0035207 | A1 * | 1/2019 | Wasinger | H05K 7/20181 |

FOREIGN PATENT DOCUMENTS

| | | | |
|---|---|---|---|
| JP | 2010246846 | A | 11/2010 |
| JP | 4803642 | B2 | 10/2011 |

* cited by examiner

GAMING MACHINE CABINET WITH THERMAL MANAGEMENT

CROSS-REFERENCE TO RELATED APPLICATIONS

The invention is related to U.S. patent application Ser. No. 18/669,780, filed May 21, 2024, entitled "Gaming Machine Cabinet With Thermal Management", by inventors Lawrence J. Knipp, Daniel Gibson and Brian Villalobos.

TECHNICAL FIELD OF THE INVENTION

The invention relates to gaming machine cabinets, and more particularly, to arrangements for thermal management of heat generated by gaming machine components.

BACKGROUND OF THE INVENTION

Gaming machines found in casinos and other gaming establishments commonly include a cabinet that supports various display devices and player interface devices. The display devices may include one or more video display monitors operable to display game-related information and other information and to display games conducted at the gaming machine such as video reel-type games, video card games, and other types of wagering games. In addition to or in lieu of video display devices, gaming machines may also include mechanical reels, wheels, or other mechanical display systems to display game results. Player interface devices may include ticket or voucher printers, various control buttons, cash-in or ticket-in devices, and player card readers. Gaming machine cabinets define an interior volume for housing various internal components such as data processing devices and supporting equipment.

To improve the operational life of the gaming machine, these components must be kept from getting too warm. Typically, cooling air is forced into the gaming machine fans at an air inlet, and then directed towards the components that require the cooling. This air inlet is typically near the bottom of the gaming machine, generally because this is where the majority of the heat generating components are located. Unfortunately, in a casino or game room environment, the floor often holds dirt, dust, cigarette smoke and tar, carpet fibers, and other debris that builds up between cleanings. This material can get drawn in the gaming machine air intake and clog filters, fans and cooling fins within the components of the gaming machine. Over time, the performance of the cooling system degrades and the effectiveness suffers, leading to premature component failure, frequent maintenance, and the resultant gaming machine downtime and loss of revenue.

SUMMARY OF THE INVENTION

It is an object of the invention to provide gaming machine cabinet with improved thermal management. It is a further object of the invention to provide a gaming machine cabinet with reduced maintenance time and costs by reducing buildup of dust and contaminants caused by cooling air flow through the gaming machine.

In the following disclosure and claims, relative positional terms such as upper, lower, top, bottom, side, right-side, left-side, above, below, and laterally, for example, are defined with reference to the orientation of the gaming machine and gaming machine cabinet compartment shown in the figures unless specifically stated otherwise.

According to one aspect of the invention, a gaming machine has a cabinet with improved thermal management. The cabinet has an outer wall forming a lower compartment and an upper compartment above the lower compartment. A processing assembly is positioned in the lower compartment and holds processing devices for controlling operation of the gaming machine. An audio amplifier assembly is also positioned n the lower compartment and holds a plurality of audio amplifiers. A power supply assembly in the lower compartment holding power conversion circuitry and DC voltage supply circuitry supplying the processing assembly and the audio amplifier assembly. An air duct is coupled to an air intake located at or above a top surface of the upper compartment, the air duct carrying cooling air to the lower compartment. A fan is positioned to pull external air into the air duct.

In some implementations, the upper compartment and the lower compartment have an opening between them allowing airflow, and an air outlet is located at or above a top surface of the upper compartment for exhausting hot air.

In some implementations, an inner wall is positioned inside the outer wall on at least one side of the cabinet, with the air duct formed between the inner wall and the outer wall.

In some implementations, the air duct includes an extension above a top surface of the cabinet.

In some implementations, a thermal plate is used, which forms at least part of a rear wall of the lower compartment and has an interior surface presented inside the lower compartment and an exterior surface presented at a rear side of the gaming machine. The thermal plate is directly thermally coupled to the processing assembly, the audio amplifier assembly, and the power supply assembly such that heat from these assemblies is thermally conducted through the thermal plate and radiated outside of the cabinet. The thermal plate may be constructed with a series of heat sink fins along the exterior surface.

In some implementations, the power supply assembly, audio amplifier assembly, and processing assembly spaced apart from each other with a surrounding area on heat plate proportional to their heat generation.

These and other advantages and features of the invention will be apparent from the following description of representative embodiments, considered along with the accompanying drawings.

DESCRIPTION OF REPRESENTATIVE EMBODIMENTS

Figure 1:
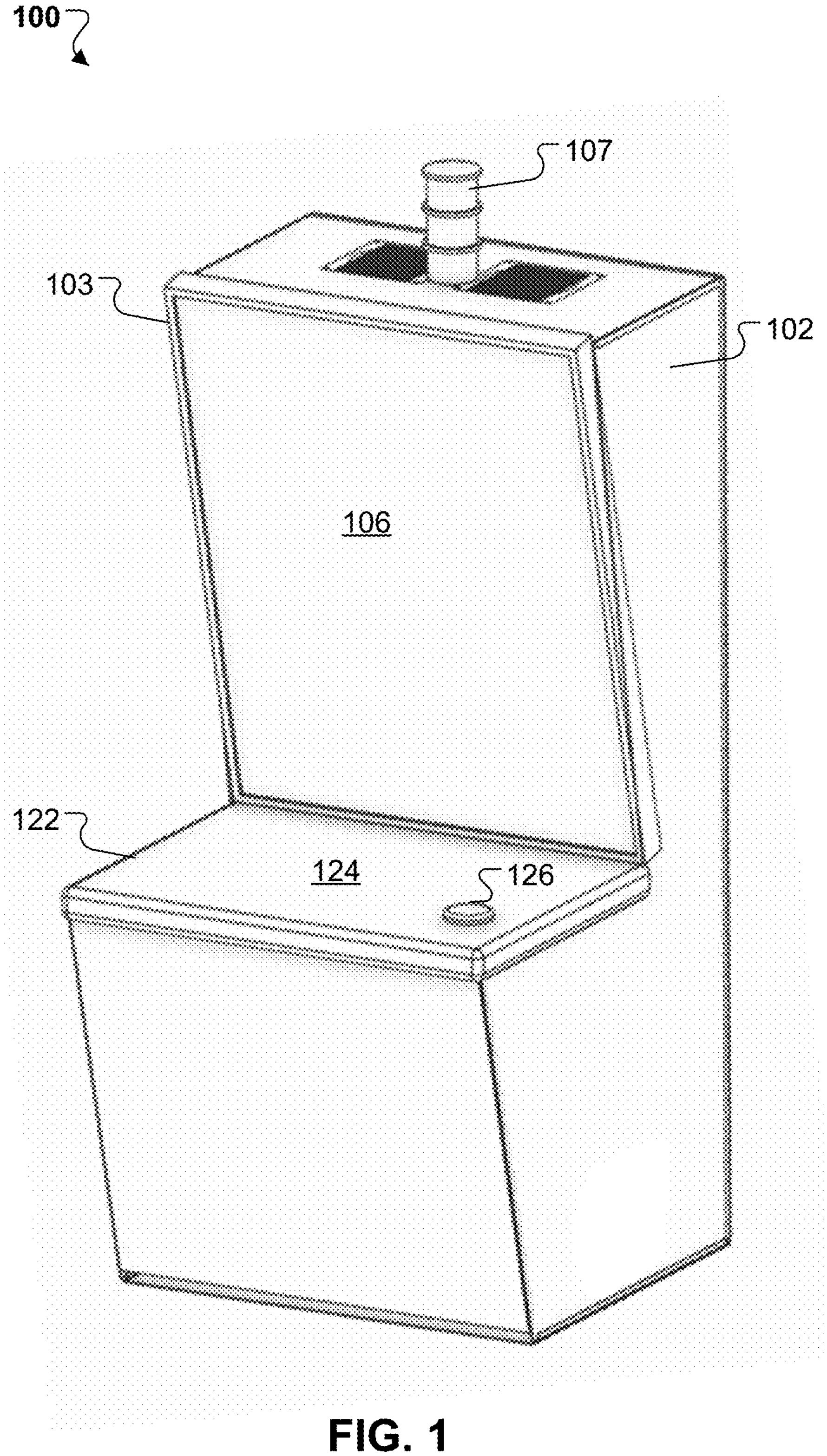
FIG. 1 shows a front perspective view of a gaming machine according to some embodiments.

FIG. 1 shows an example gaming machine 100 including a gaming machine cabinet 102 with improved thermal management features. Cabinet 102 is generally formed by panels mounted on a frame to form the visible outer wall. Along the front of cabinet 102 is mounted a display assembly 103, a player control deck 122, and a topper or candle light assembly 107. Display assembly 103 includes at least a primary display 106 oriented toward the front side of cabinet 102, which may have a front glass cover. Gaming machine 100 further includes a player control deck 122 extending forwardly below display assembly 103. This example player control deck 122, which may also be referred to as a "button deck," includes a player control touchscreen video display device 124 for presenting a touch-screen display interface to the player, together with a mechanical "play" button 126. Various audio speaker assemblies (not shown separately) may be integrated with display assembly 103, or otherwise mounted around the periphery of display assembly 103 or beneath player control deck 122.

Figure 2:
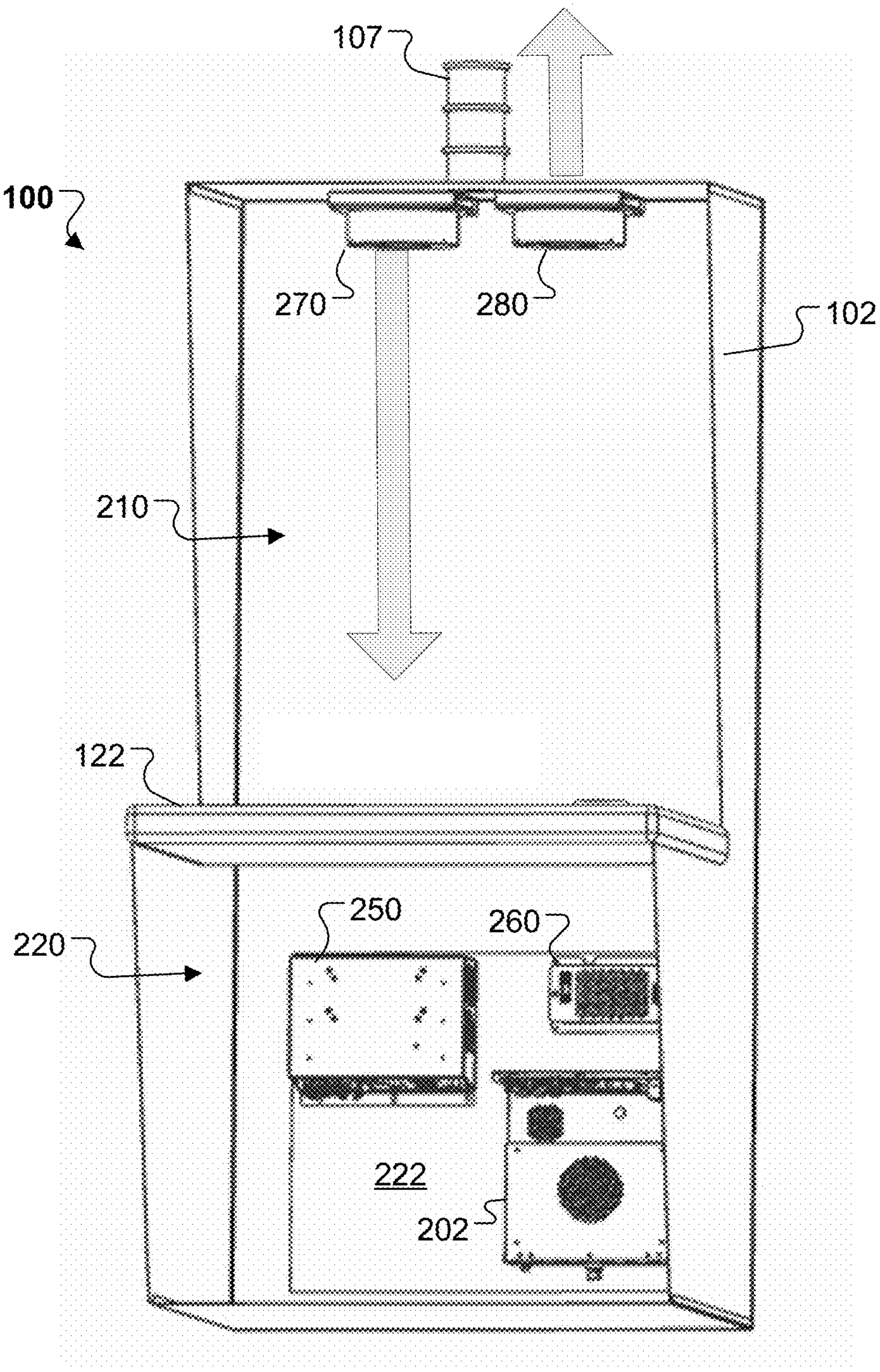
FIG. 2 shows a front perspective cutaway view of the gaming machine of FIG. 1.

FIG. 2 shows a front perspective cutaway view of the gaming machine 100 of FIG. 1. The cutaway view shows an upper compartment 210 and a lower compartment 220. Upper compartment 210 is generally bounded by top, side, and rear panels of cabinet 102, along with display assembly 103, and in this embodiment has an opening to lower compartment 220. Lower compartment 220 is bounded by lower front, side, rear, and bottom panels of cabinet 102 along with player control deck 122. The display assembly 103 and lower front panel of cabinet 102 are removed to illustrate the relevant assemblies in gaming machine 100. Other internal components such as wiring harnesses, connectors, and audio speaker assemblies are also not shown in the view.

Cabinet 102 includes structures and devices to manage the heat produced by various electronics in gaming machine 100, including air flow management for cooling, and thermally conductive structures for conducting heat away from heat sources and dissipating it. thermal plate 222 is used to conduct heat from the interior of gaming machine 100 to the exterior. In this embodiment, thermal plate 222 defines at least part of a rear wall of the lower compartment 220. Thermal plate 222 is a heat conductive metal plate having an interior surface presented inside the lower compartment 220 and an exterior surface presented at a rear side of cabinet 102.

Gaming machine 100 includes a processing assembly 202 in the lower compartment. Processing assembly 202 generally includes one or more processing devices operable for controlling operation of the gaming machine. The processing devices typically include a CPU, GPU, and other circuits mounted on at least one circuit board and held in a metal housing including at least one heat conductive outer surface. In this embodiment, an aluminum chassis is used, which is mounted to thermal plate 222 with screws, with a heat conductive outer surface positioned against thermal plate 222.

An audio amplifier assembly 260 includes a plurality of audio power amplifiers operatively coupled to processing assembly 202. Audio amplifier assembly 260 also includes a metal chassis, preferably aluminum, with at least one heat conductive outer surface positioned against thermal plate 222 when audio amplifier assembly 260 is screwed onto thermal plate 222 as depicted.

Power supply assembly 250 holds power conversion circuitry and DC voltage supply circuitry supplying power to processing assembly 202 and the audio amplifier assembly 260. Like those two modules, power supply assembly is constructed in a metal chassis, preferably aluminum, and mounted to thermal plate 222 with screws with least one heat conductive outer surface in contact with thermal plate 222.

Thermal plate 222 is thereby directly thermally coupled to the heat conductive outer surfaces of processing assembly 202, audio amplifier assembly 260, and power supply assembly 250 such that heat from these assemblies is conducted through thermal plate 222 and radiated at the rear outside of the cabinet 102. Thermal plate 222 is formed of a heat conductive material. Preferably a metal is used such as aluminum, an aluminum alloy, or another suitable metal or alloy. In some embodiments, thermal plate 222 is a "cold plate" with internal liquid cooling channels, while in other embodiments no cooling channels are used and thermal plate 222 is a passive heat conductor, constructed only of metal or other heat conductive materials. In some embodiments, thermal plate 222 is further cooled by fans or other air blowers which may direct air over its interior surface or exterior surface.

In addition to conducting heat to the exterior of cabinet 102, air flow is also managed through the gaming machine to improve heat dissipation by convection. While gaming machine cabinets often include an air intake in a lower portion of the gaming machine for cooling air, the present inventors have found a number of deleterious effects arise from such designs. In particular, the air near the floor of a casino or gaming room often carries a large amount of dust, smoke particles, and fibers, which all tend to collect on surfaces such as heat sink fins and fan intake screens. Such collection often decreases air flow and reduces convection and internal radiation of heat by creating blockages or insulative build-up of fibers and particles, resulting in an increased need for maintenance activity to clean the build-up. While filters may help prevent such problems, filters used on air intakes near the bottom of gaming machines will tend to get clogged very quickly and require frequent changing by maintenance personnel.

To solve such problems, in this embodiment, at least one air intake is located at or above a top surface of the upper compartment. As shown, an air intake 270 is present along the top surface of cabinet 102, each including an opening with a grill, and a fan for directing air into cabinet 102 from above the top surface. Cool air from above gaming machine 100 is directed as shown by the grey arrows, and flows downward through upper compartment 210 around the interior surfaces of display assembly 103 (FIG. 1) thereby cooling them by convection, and into lower compartment 220, where it flows around processing assembly 202, audio amplifier assembly 260, and power supply assembly 250, cooling them by convection. Upper compartment and the lower compartment have an opening between them allowing airflow. Interior air is directed out of cabinet 102 through air outlet 280, each include a vent passing from upper compartment 210 to the exterior of cabinet 102 for exhausting heated air from upper compartment 210, and a fan positioned to push internal air through the air outlet. Both air intakes 270 and air outlet 280 include protective grills and may include an air filter positioned upstream or downstream of the fan.

While the depicted air intake includes an opening at the top surface of cabinet 102, in some other embodiments an air intake may be higher than the top surface, extending above the top surface to form an extension or "snorkel" structure, for example. An intake fan may be used with such a snorkel intake with the fan positioned inside upper compartment 210 as depicted. Pulling cool air from higher above the gaming machine top using a snorkel has the advantage of pulling in less particulates in many casino environments. The snorkel structure may also include filter, held in a slot with easy access for changing the filter without opening the cabinet.

Figure 3:
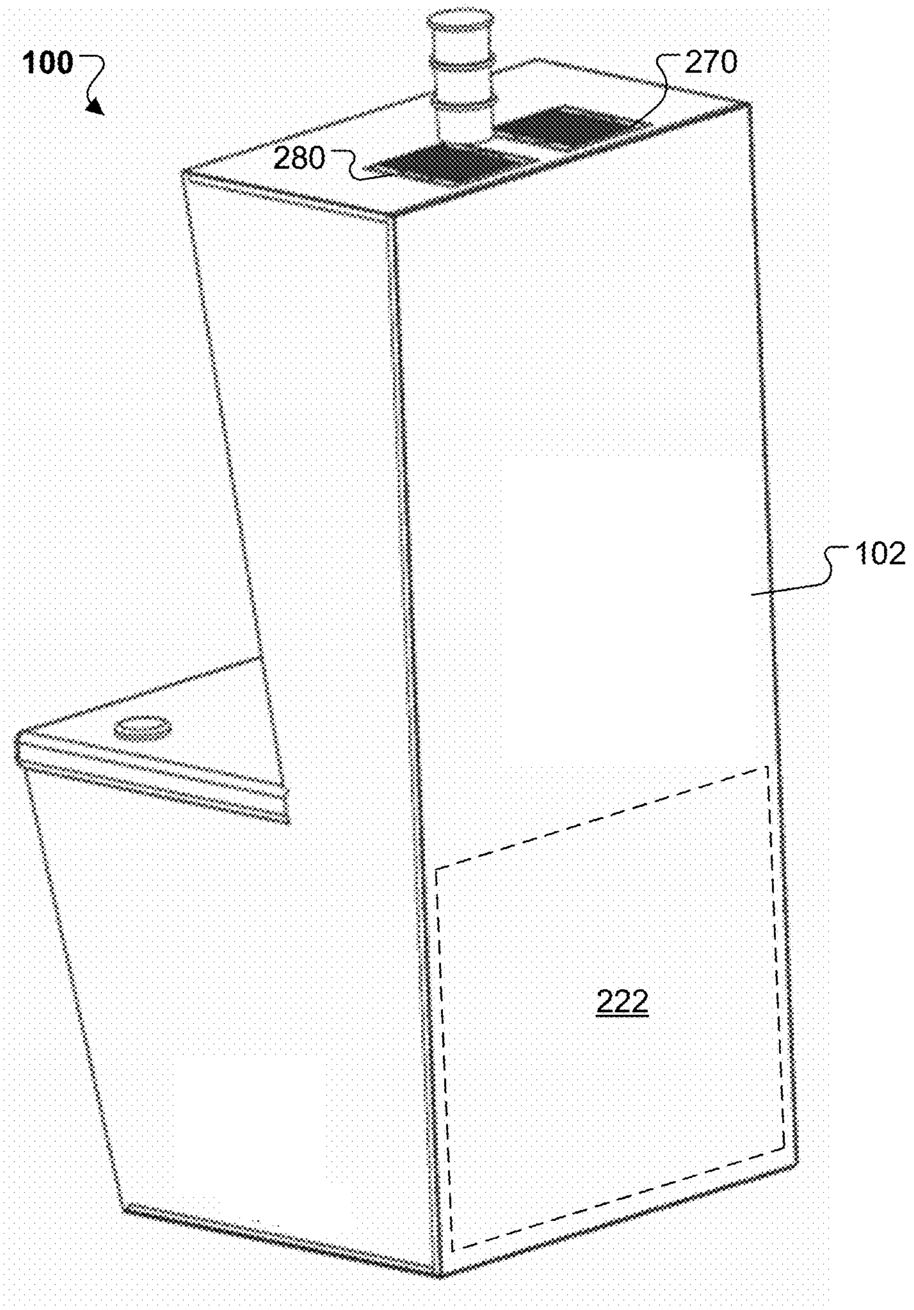
FIG. 3 shows a right rear perspective view of the gaming machine of FIG. 1.

FIG. 3 shows a right rear perspective view of the gaming machine 100 of FIG. 1. Along the rear surface of cabinet 102, the exterior surface of thermal plate 222 can be seen. Thermal plate 222 form a rear, lower panel of cabinet 102, or may comprise a large portion of such a panel as depicted by the dotted lines, for example by being installed in a frame in a larger panel. In some embodiments, the exterior surface of thermal plate 222 may dissipate heat directly into the air at the rear of gaming machine 100 through radiation and convection, while in other embodiments one or more heat sinks may be attached to the exterior surface of thermal plate 222.

Figure 4:
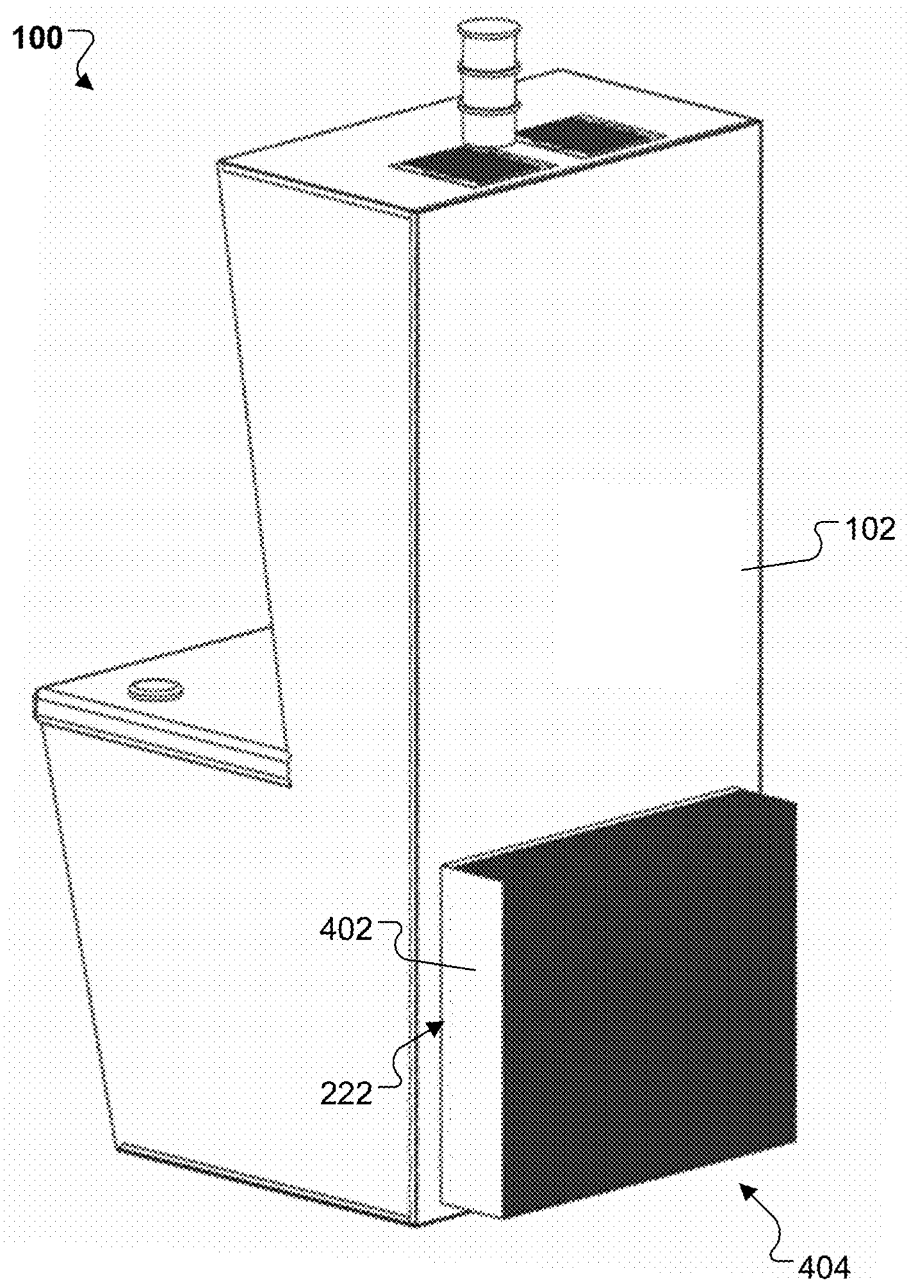
FIG. 4 shows a right rear perspective view of a gaming machine with a heat sink installed on the thermal plate according to some embodiments.
Figure 5:
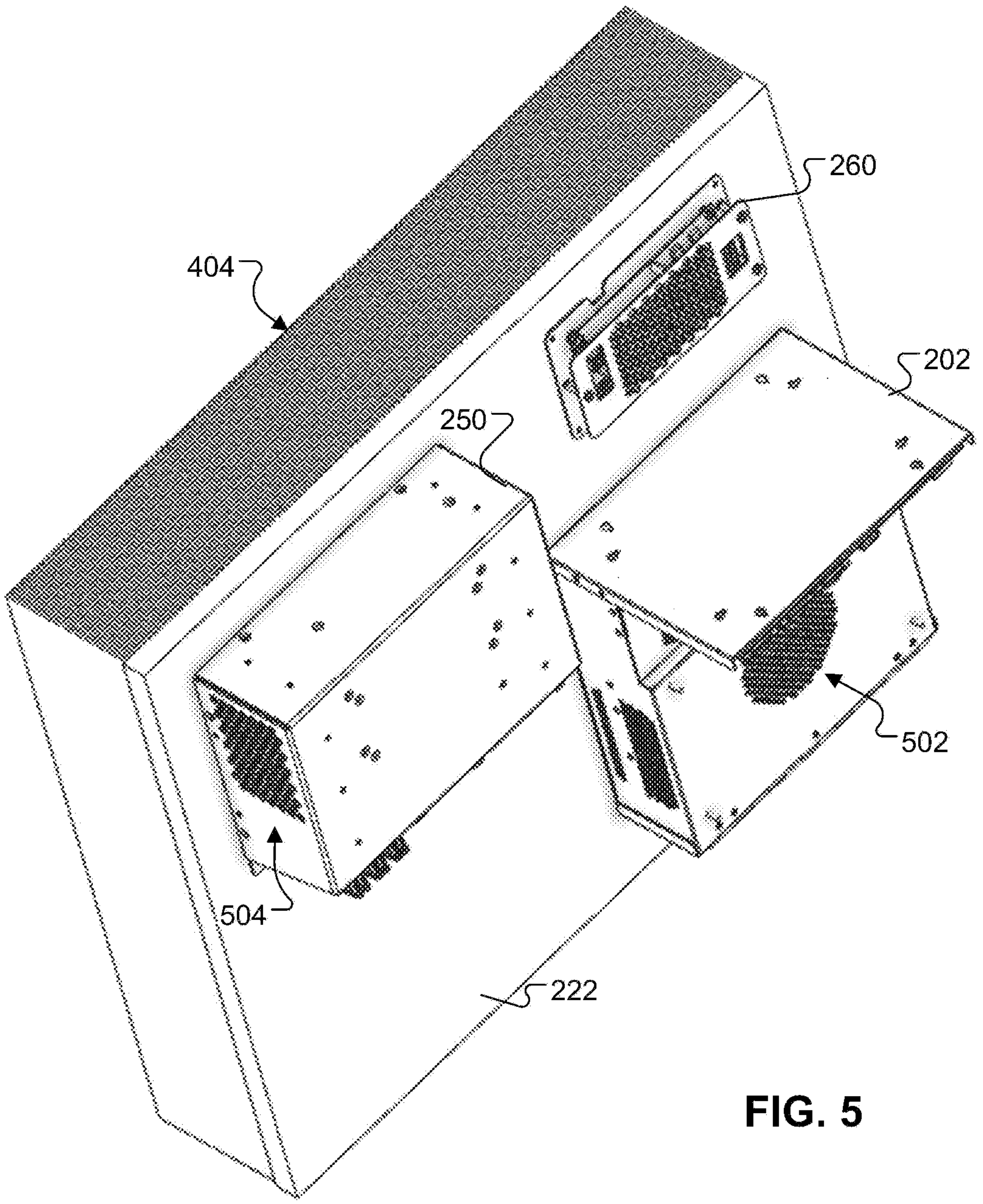
FIG. 5 shows a cutaway top perspective view of a thermal plate and heat sink, and the various assemblies mounted to thermal plate of the gaming machine of FIG. 4.

FIG. 4 shows a right rear perspective view of a gaming machine 100 with a heat sink 402 installed on thermal plate 222 according to an example embodiment. FIG. 5 shows a cutaway top perspective view of thermal plate 222, heat sink 402, and the various assemblies mounted to thermal plate 222. Referring to FIG. 4 and FIG. 5, heat sink 402 in this embodiment includes heat radiating structure, such as the fins shown on heat sink 404, extending away from thermal plate 222. While heat sink fins are used in this embodiment, in other embodiments, any other suitable heat sink structure may be used, such as an array of pins, radiator coils, or other shapes of fins, for example. Heat radiating structure 404 may be formed in the same piece as thermal plate 222, or, more typically, attached to its exterior surface.

Processing assembly 202 in this embodiment comprises an aluminum housing with a rear surface screwed flat onto thermal plate 222, and includes its own cooling fan for pulling cooling air through an intake 502 in the housing. The interior construction of processing assembly 202 is preferably arranged such that heat generated by the processing IC chips therein, such as CPU, GPU, or system-on-chip data processor, are thermally to the housing to increase the heat conduction to the exterior of cabinet 102 through thermal plate 222. Preferably, processing assembly 202 comprises a circuit board along which is mounted a packaged processor IC with a heat sink thermally coupling the packaged processor IC to an inner surface of processing assembly 202 opposite the heat conductive outer surface of processing assembly 202.

Power supply assembly 250 includes an aluminum housing holding at least one voltage converter and a number of regulated power supplies for supplying DC voltages to the depicted assemblies 202 and 260, as well as other circuits in gaming machine 100. A thermally conductive rear surface of the housing is screwed flat onto thermal plate 222. Thermal paste may be used between the surfaces to minimize air and maximize thermal conductivity between the respective housings of assemblies 202, 250, and 260 and thermal plate 222. Like processing assembly 202, power supply assembly 250 is preferably constructed to maximize thermal conductivity to rear surface of the housing. In particular, a number of voltage regulation transistors of the various voltage supplies, which tend to generate the most heat, are thermally coupled to the heat conductive outer surface of the power supply assembly directly or indirectly though one or more heat sinks. Power supply assembly 250 may also include an internal fan for directing air through an inlet 504 for cooling, which then passes through a similarly sized air outlet on the opposing side.

Audio amplifier assembly 260 includes a number of audio power amplifiers for driving various speakers in gaming machine 100, housed in an aluminum chassis. These power amplifiers include a plurality of power transistors driving an audio signal to respective ones of the audio speakers. The power transistors are thermally coupled to the heat conductive rear surface directly or indirectly though one or more heat sinks, with assembly 260 mounted to thermal plate 222 with screws.

As can be seen, the various assemblies 202, 250, and 260 are mounted to thermal plate 222 spaced apart from each other having a surrounding area on heat plate 222 proportional to their heat generation, in order to improve thermal conductivity and the subsequent radiation from heat sink 404. In other embodiments, the assemblies may be spaced apart sufficient to provide them each enough surrounding area on thermal plate 222 to reduce heat transfer from one assembly to the other. In some embodiments, the assemblies are separated on thermal plate 222 by a designated minimum distance, such as one, two, three, or five inches, for example.

Figure 6:
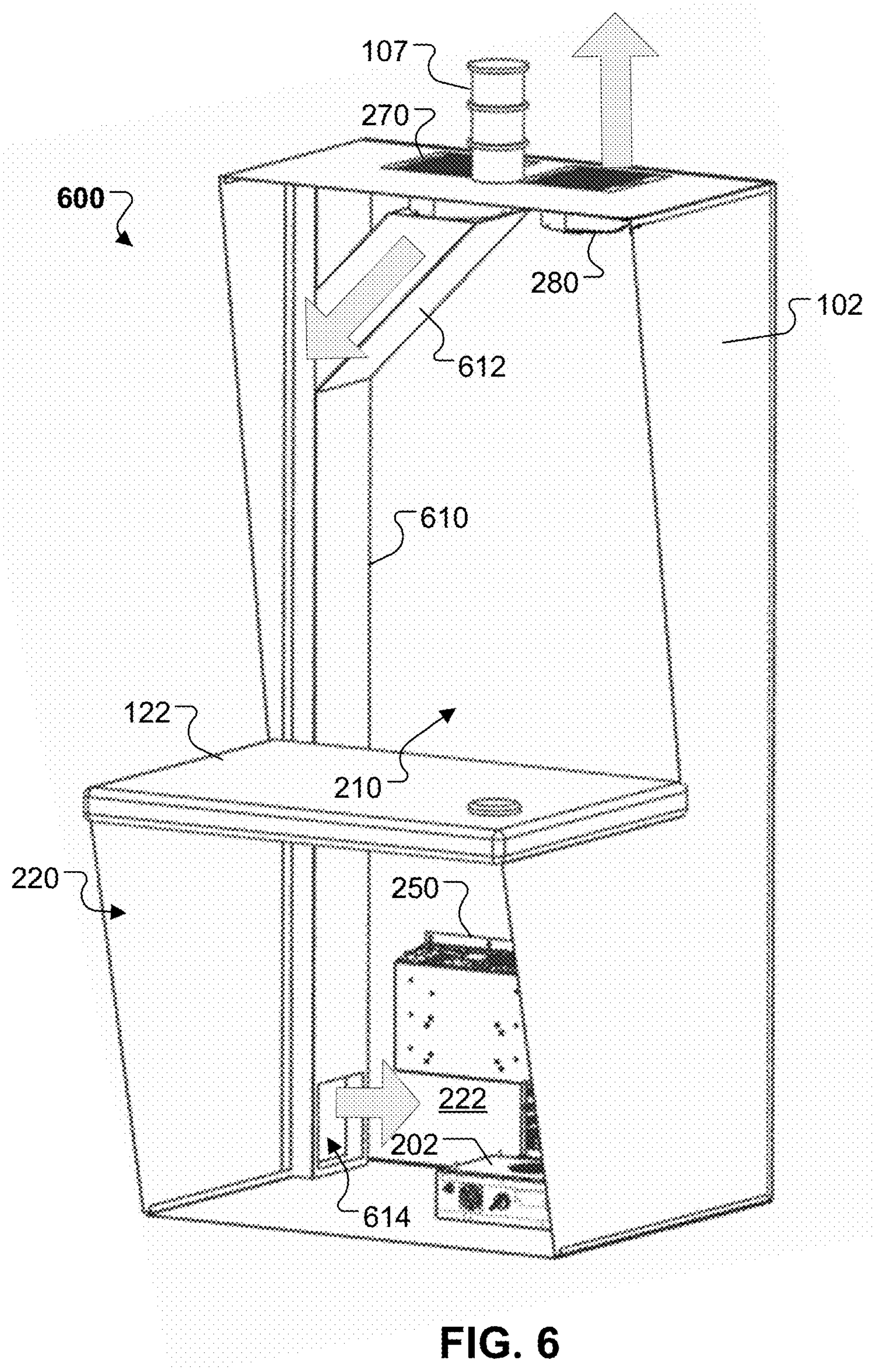
FIG. 6 shows a front perspective cutaway view of a gaming machine according to another embodiment.

FIG. 6 shows a front perspective cutaway view of a gaming machine 600 according to another embodiment. Gaming machine 600 is generally constructed like that of FIG. 2, with the addition of an air duct 610 for moving cool air from air intake 270 to lower compartment 220. The fan of air intake 270 is positioned to pull external air into air duct 610 by directing an angular duct 612 connected to air duct 610. The cool air then passes through air vent 614 which is an opening from air duct 610 into lower compartment 220. In this embodiment, air duct 610 is formed along an outer wall of cabinet 102 and passes vertically along the rear corner of cabinet 102 behind player control deck 122. Air duct 610 has a rectangular cross section of 1-3 inches in depth and 8-10 inches in length. In some embodiments, an inner wall may be included formed by inner side and rear panels of cabinet 102, with air duct 610 contained between the inner surface of the cabinet's outer wall and the inner wall, or having at least part of its structure formed by the inner wall. In other embodiments, air duct 610 may be implemented in other ways, such as with a flexible tube. For example a flexible air duct tube may be direct air along the path shown in FIG. 6.

A thermal plate 222 as described with respect to FIGS. 2-5 may be used in combination with air duct 610 to improve cooling and mitigate dust and particle buildup inside gaming machine 600, or either the thermal plate or air duct 610 may be used alone. As shown by the arrows, air is pulled into intake 270 from at or above the top surface of cabinet 102, and flows out of vent 614 into lower compartment 220 where passes over the various electronic assemblies to cool them. The warmed air is then exhausted out of air outlet 280. In other embodiments, warm air may be exhausted from an air outlet in another position. For example, one or more air outlets may exhaust air directly from the lower compartment, out the right, left, back, or front walls of cabinet 102.

Figure 7:
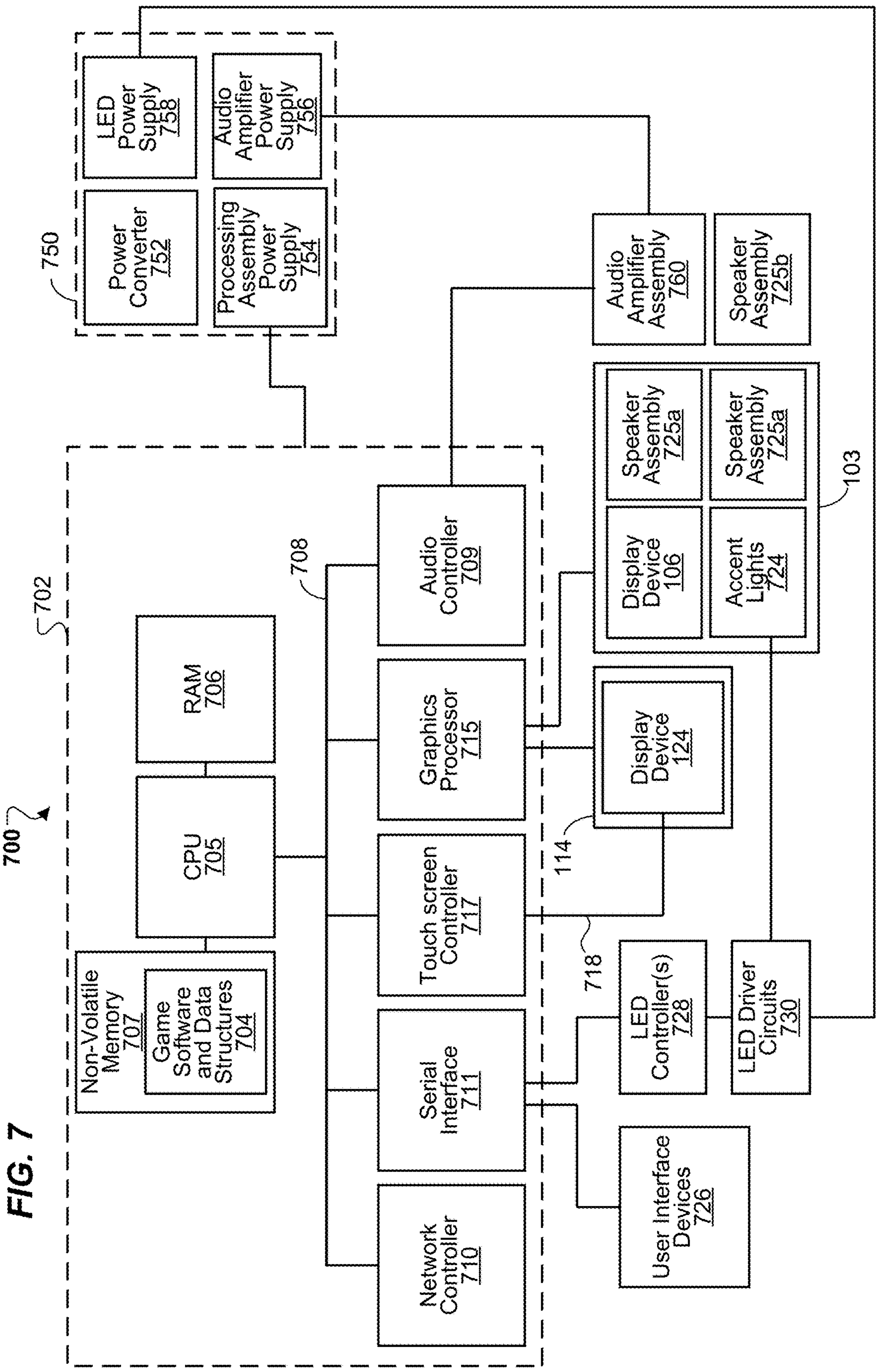
FIG. 7 is a block diagram showing the various components that may be included in the gaming machine shown in FIG. 1.

FIG. 7 shows a logical and hardware block diagram 700 of gaming machine 100 that generally includes a processing assembly 702, a power supply assembly 750, and an audio amplifier assembly 760, and various interface devices. The depicted design is suitable for use in the gaming machine cabinet designs described above with respect to FIG. 1-FIG. 6.

Processing assembly 702 is one suitable implementation of processor assembly 202, and includes a processor (CPU)

705 along with a suitable connection to random access memory (RAM) 706 and a suitable connection to non-volatile memory 707. CPU 705 is connected on a system bus 708 with an audio controller device 709, a network controller 710, a serial interface 711, a graphics processor 715, and a touch screen controller 717. Graphics processor 715, or another graphics processor included in the gaming machine but not shown in this diagram, may provide a suitable video output to a video display device 124 mounted in display assembly 103 and a video display device 722 mounted in display assembly 103.

Power supply assembly 750 is one suitable implementation of power supply assembly 250, and generally includes a power converter 752, a processing assembly power supply 754, an audio amplifier power supply 756, and an LED power supply 758. Power converter 752 is connected to the other power supplies in assembly 750 and includes a transformer or other suitable converter for converting AC voltages to DC. While a single power converter 752 is shown, multiple power converters may be used, one for each power supply. Processing assembly power supply 765 includes filtered and regulated voltage supply circuitry and is connected to processing assembly 702 for providing suitable regulated DC voltages. Audio amplifier power supply 756 contains filtered and regulated voltage supply circuitry and is connected to audio amplifier assembly 760 for supplying a regulated DC voltage suitable for driving the audio amplifiers therein. LED power supply 758 similarly contains filtered and regulated voltage supply circuitry and is connected to LED driver circuits 730 for supplying a regulated DC voltage suitable for driving the LEDs for accent lights 724. A separate regulated DC supply may also be included for display devices 124 and 106, or they may be supplied from processing assembly power supply 754, directly or through processing assembly 702.

Video display device 722 in this example comprises a video display such as an LCD or OLED display, for example, display 106 mounted in display assembly 103 in FIG. 1. In the example of FIG. 7, display device 124 is shown as a touchscreen display device having a touch screen element connected via signal path 718 to touch screen controller 717. It will be appreciated that the touch screen element itself may comprise a thin film element on or associated with display 124 and is not shown separately in these views. Touch screen controller 717 may also be connected via a suitable signal path (not shown) to receive signals from a touch screen element (not shown) associated with display device 124 mounted on the player control deck 122 in this example.

Those familiar with data processing devices and systems will appreciate that other basic electronic components will be included in gaming machine 100 such as a power supply, cooling systems for the various system components, and other devices that are common in gaming machines. These additional devices are omitted from the drawings so as not to obscure the present invention in unnecessary detail.

All of the elements 705, 706, 707, 708, 709, 710, and 711 shown in FIG. 7 are elements commonly associated with gaming machine construction, and may be specially designed and configured for use in a gaming environment. These elements may be mounted on one or more circuit boards housed within cabinet 102 with or without a separate enclosure. Those familiar with data processing systems and the various data processing elements shown in FIG. 7 will appreciate that many variations on this illustrated structure may be used within the scope of the present invention. For example, since serial communications are commonly employed to communicate with a touch screen controller such as touch screen controller 717, the touch screen controller may not be connected on system bus 708, but instead include a serial communications line to serial interface 711 (a USB controller for example). Also, each touch screen may include a dedicated touch screen controller. It will also be appreciated that some of the devices shown in FIG. 7 as being connected directly on system bus 708 may in fact communicate with the other system components through a suitable expansion bus. Where such a controller is included in a gaming machine in accordance with the present invention, audio controller 709, for example, may be connected to the system via a PCI or PCIe bus or bus configured according to some other expansion bus standard. System bus 708 is shown in FIG. 7 merely to indicate that the various components are connected in some fashion for communication with CPU 705 and is not intended to limit the invention to any particular bus architecture.

Numerous other variations in the gaming machine internal structure and system may be used without departing from the principles of the present invention. For example, a gaming machine in some embodiments of the present invention may rely on one or more data processors located remotely from the gaming machine itself. Embodiments of the present invention may include no processor such as CPU 705 or graphics processor such as 715 at the gaming machine and may instead rely on one or more remote processors. Thus unless specifically stated otherwise, the designation "gaming machine" is used in this disclosure and the accompanying claims to designate a system of devices that operate together to provide the indicated functions. A "gaming machine" may include a gaming machine such as gaming machine 100 shown in FIG. 1 and in in block diagram form in FIG. 7, that is itself a system of various components, and may also include one or more components remote from a gaming machine cabinet (that is, remote from the cabinet 102 of gaming machine 100 in FIG. 1). As used herein, the designation "gaming machine" and "gaming machine cabinets" encompasses both a stand-alone gaming machine and a gaming machine which interfaces with one or more remote components for providing various functions (such as identifying prizes for a given play and controlling result display graphics and performing other operations).

The invention is not limited to any particular arrangement of processing devices for controlling the display devices included with gaming machine 100, including the display device included with a display assembly in accordance with the present invention. Also, a gaming machine implementing the present invention is not limited to any particular number of video display devices or any particular types of display devices. Also, the display devices 106 and 124 in FIG. 1 may be arranged differently than the orientation shown.

Control of display devices 124 and 106 will include a suitable driving signal for driving the respective display. Such a driving signal may include any video signal format or standard that the respective display device is adapted to receive. For example, a DisplayPort, HDMI, or DVI signal may be used to drive a respective one of the displays to provide the desired images. Of course, each display will commonly receive operating power separately from the display driving signal. The above-noted video standards also incorporate digital audio signals for driving audio speakers such as speakers associated with audio speaker assemblies **725*a* included with display assembly 103. Alternatively to providing an audio input for audio speaker assemblies 725*a* and 725*b* through a DisplayPort, HDMI, or DVI signal for example, the signals for driving audio speaker assemblies 725***a* and 725*b* associated with display assembly 103 may be provided directly from audio controller 709.

Amplification for the audio signals provided to drive audio speaker assemblies 725*sa* and 725*b* is provided by audio amplifier assembly 760, which is one suitable implementation of audio amplifier assembly 260. Each audio speaker assembly 725*a* and 725*b* may include a suitable digital to analog converter for producing an analog audio signal from the digital audio information provided from the signal communicated from graphics processor 715. Alternatively, a two-channel audio amplifier may be used to convert the digital audio to analog and provide the desired amplification. In cases where audio controller 709 provides signal processing for the audio signals used to drive speaker assemblies 725*a* and 725*b*, digital to analog conversion may be performed by audio controller 709 and amplification may be provided by the audio controller as well or with amplifiers incorporated with the speaker assemblies or separate from the speaker assemblies.

FIG. 7 shows that gaming machine 100 also has an accent light control system including LED controllers 728 connected for serial communications through serial interface 711. Each LED controller 728 is operatively connected to driver circuits 730 that are each connected to apply LED driving signals to a respective LED light associated with the accent lights associated with the display assembly 103.

In this example, CPU 705 executes software, that is, program code represented at 704 in FIG. 7, that ultimately controls the entire gaming machine including the receipt of player inputs and the presentation of the graphics or information displayed through the display devices 124 and 106 and any other display devices associated with the gaming machine. This program code may include various data structures defining various assets (such as graphics assets for example) employed in the course of presenting the given game at gaming machine 100. CPU 705 also executes software related to communications handled through network controller 710, and software related to various peripheral devices such as those connected to the system through audio controller 709, serial interface 711, and touch screen controller 717. CPU 705 may also execute software to perform accounting functions associated with game play. Network controller 710 provides an interface to other components of a gaming system in which gaming machine 100 may be included.

User interface devices 726 are part of a player input system connected to serial interface 711. These user interface devices may include various player input devices such as "play" button 126 in FIG. 1 and other mechanical buttons, virtual buttons shown on touchscreen display device 124 in FIG. 1, and/or levers, and other devices. It will be appreciated that the interface between CPU 705 and other player input devices such as player card readers, voucher readers or printers, and other devices may be in the form of serial communications may be included in the player input system.

As used herein, whether in the above description or the following claims, the terms "comprising," "including," "carrying," "having," "containing," "involving," and the like are to be understood to be open-ended, that is, to mean including but not limited to. Also, it should be understood that the terms "about," "substantially," and like terms used herein when referring to a dimension or characteristic of a component indicate that the described dimension/characteristic is not a strict boundary or parameter and does not exclude variations therefrom that are functionally similar. At a minimum, such references that include a numerical parameter would include variations that, using mathematical and industrial principles accepted in the art (e.g., rounding, measurement or other systematic errors, manufacturing tolerances, etc.), would not vary by more than 5%.

Any use of ordinal terms such as "first," "second," "third," etc., in the following claims to modify a claim element does not by itself connote any priority, precedence, or order of one claim element over another, or the temporal order in which acts of a method are performed. Rather, unless specifically stated otherwise, such ordinal terms are used merely as labels to distinguish one claim element having a certain name from another element having a same name (but for use of the ordinal term).

The term "each" may be used in the following claims for convenience in describing characteristics or features of multiple elements, and any such use of the term "each" is in the inclusive sense unless specifically stated otherwise. For example, if a claim defines two or more elements as "each" having a characteristic or feature, the use of the term "each" is not intended to exclude from the claim scope a situation having a third one of the elements which does not have the defined characteristic or feature.

The above-described embodiments are intended to illustrate the principles of the invention, but not to limit the scope of the invention. Various other embodiments and modifications to these representative embodiments may be made by those skilled in the art without departing from the scope of the present invention. For example, in some instances, one or more features disclosed in connection with one embodiment can be used alone or in combination with one or more features of one or more other embodiments. More generally, the various features described herein may be used in any working combination.

The invention claimed is:

1. A gaming machine including:

a cabinet having an outer wall forming a lower compartment and an upper compartment above the lower compartment;

a processing assembly positioned in the lower compartment and holding one or more processing devices operable for controlling operation of the gaming machine;

an audio amplifier assembly in the lower compartment holding a plurality of audio power amplifiers operatively coupled to the processing assembly;

a power supply assembly in the lower compartment holding power conversion circuitry and DC voltage supply circuitry supplying the processing assembly and the audio amplifier assembly;

a player interface system operably connected the one or more processing devices;

a display system providing a display toward a front side of the gaming cabinet and operatively connected to the one or more processing devices;

a plurality of audio speakers operatively connected to the audio amplifier assembly;

an air duct coupled to an air intake located at or above a top surface of the upper compartment, the air duct carrying cooling air to the lower compartment;

a fan positioned to pull external air into the air duct; and a thermal plate defining at least part of a rear wall of the lower compartment and comprising a heat conductive metal plate having an interior surface presented inside the lower compartment and an exterior surface presented at a rear side of the gaming machine, the thermal plate being directly thermally coupled to the processing assembly, the audio amplifier assembly, and the power supply assembly such that heat from these assemblies is thermally conducted through the thermal plate and radiated outside of the cabinet.

2. The gaming machine of claim 1 wherein the upper compartment and the lower compartment have an opening between them allowing airflow, and further comprising an air outlet located at or above a top surface of the upper compartment for exhausting hot air.

3. The gaming machine of claim 1 further comprising an inner wall positioned inside the outer wall on at least one side of the cabinet, the air duct formed between the inner wall and the outer wall.

4. The gaming machine of claim 1 further comprising a series of heat sink fins along the exterior surface of the thermal plate.

5. The gaming machine of claim 1 wherein the power supply assembly, audio amplifier assembly, and processing assembly are spaced apart from each other with a surrounding area on heat plate proportional to their heat generation.

6. The gaming machine of claim 1 wherein the thermal plate and heat sink fins are constructed of one of aluminum or an aluminum alloy.

* * * * *